United States Patent
Tang

(10) Patent No.: US 10,573,846 B2
(45) Date of Patent: Feb. 25, 2020

(54) OLED DEVICE HAVING A PACKAGING STRIP SURROUNDING THE EDGES OF A SUBSTRATE AND PACKAGING LAYER

(71) Applicant: Wuhan China Star Optoelectronics Technology Co., Ltd., Wuhan, Hubei (CN)

(72) Inventor: Yuejun Tang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 143 days.

(21) Appl. No.: 15/579,374

(22) PCT Filed: Nov. 14, 2017

(86) PCT No.: PCT/CN2017/110890
§ 371 (c)(1),
(2) Date: Jan. 9, 2018

(87) PCT Pub. No.: WO2019/085018
PCT Pub. Date: May 9, 2019

(65) Prior Publication Data
US 2019/0221777 A1   Jul. 18, 2019

(30) Foreign Application Priority Data

Nov. 2, 2017   (CN) .......................... 2017 1 1061768

(51) Int. Cl.
*H01L 29/08*   (2006.01)
*H01L 33/00*   (2010.01)
(Continued)

(52) U.S. Cl.
CPC ...... *H01L 51/5259* (2013.01); *H01L 51/5012* (2013.01); *H01L 51/5246* (2013.01); *H01L 51/5253* (2013.01); *H01L 51/56* (2013.01)

(58) Field of Classification Search
CPC . H01L 51/50; H01L 51/5012; H01L 51/5246; H01L 51/5253; H01L 51/56
See application file for complete search history.

(56) References Cited

U.S. PATENT DOCUMENTS

| 2007/0240914 A1* | 10/2007 | Lai .......................... G06F 3/044 178/18.06 |
| 2015/0034926 A1* | 2/2015 | Nakata ................ H01L 51/5234 257/40 |

FOREIGN PATENT DOCUMENTS

| CN | 1578553 A | 2/2005 |
| CN | 101517771 A | 8/2009 |
| CN | 106159106 A | 11/2016 |

* cited by examiner

*Primary Examiner* — Alonzo Chambliss
(74) *Attorney, Agent, or Firm* — Hemisphere Law, PLLC; Zhigang Ma

(57) ABSTRACT

An OLED device and a packaging method of OLED are provided. The OLED device includes substrate, packaging layer, light-emitting layer, and packaging strip. The light-emitting layer is positioned between substrate and packaging layer. The packaging strip is packaging edge of packaging layer and edge of substrate. The light-emitting layer is enclosed in a space surrounded by substrate, packaging layer and packaging strip. It encloses a space for light-emitting layer by substrate, packaging layer, packaging strip according packaging strip enveloping periphery of upper and lower surface of substrate and packaging layer. Also, positioning sealant between packaging strip and substrate, and between packaging strip and packaging layer, it provides better package effectiveness therebetween. Therefore, it is elongating the path which enters from sealant position to inner (Continued)

of OLED device by moisture, oxygen and so on. It enhances blocking effect of moisture, oxygen in display device, and ensures the lifetime and reliability.

20 Claims, 8 Drawing Sheets

(51) Int. Cl.
*H01L 31/0232* (2014.01)
*H01L 31/0203* (2014.01)
*H01L 21/00* (2006.01)
*H01L 51/40* (2006.01)
*H01L 51/52* (2006.01)
*H01L 51/50* (2006.01)
*H01L 51/56* (2006.01)

OLED DEVICE HAVING A PACKAGING STRIP SURROUNDING THE EDGES OF A SUBSTRATE AND PACKAGING LAYER

RELATED APPLICATIONS

The present application is a National Phase of International Application Number PCT/CN2017/110890, filed Nov. 14, 2017, and claims the priority of China Application No. 201711061768.X, filed Nov. 2, 2017.

BACKGROUND OF THE INVENTION

1. Field of the Invention

The disclosure relates to an OLED device packaging technical field, and more particularly to an OLED device and a packaging method of OLED device.

2. The Related Arts

Currently, OLED displays are receiving much attention as an image display device for mobile electronic devices. Comparing with LCD and other display apparatus, OLED device has self-luminous characteristic and without individual light source. Therefore OLED display could be thinner, lighter than the individual light display device, and more easily to achieve property of flexible, foldable display. In addition, OLED also has high quality property for example low power consumption, high brightness and fast response speed.

However, the OLED easily deteriorated by internal factor for example, deteriorated between electoral and light-emitting layer by oxygen, deteriorated by reaction between light-emitting layer and interface, and deteriorated by external factor for example external moisture, oxygen, UV light and some manufacture factors. Especially, external oxygen and moisture will cause lethal effect of device lifetime so that package of the OLED is very important.

SUMMARY

A technical problem to be solved by the disclosure is to provide n OLED device and a packaging method of OLED device, which could ensure the packaged effect of display device, and enhances the device lifetime and reliability.

An objective of the disclosure is achieved by following embodiments.

In particular, an OLED device includes a substrate, a packaging layer, a light-emitting layer, and a packaging strip. The light-emitting layer is positioned between the substrate and the packaging layer, and the packaging strip is packaged on an edge of the packaging layer and an edge of the substrate, the light-emitting layer is enclosed in a space surrounded by the substrate, the packaging layer and the packaging strip.

In an embodiment, two ends of the packaging strip are respectively extending to cover an outer surface of the substrate and an outer surface of the packaging layer.

In an embodiment, between an inner surface of the packaging strip and the outer surface of the substrate, and between an inner surface of the packaging strip and the outer surface of the packaging layer, which are filled by sealant.

In an embodiment, the packaging strip comprises a combination portion and two envelope portions respectively extended from the combination portion, the combination portion is positioned between the substrate and the packaging layer, two envelope portions are respectively enveloping an end of and an edge of the outer surface of the substrate and an end of and an edge of the outer surface of the packaging layer between the combination portion and the substrate, and/or, between the combination portion and the packaging layer are filled by sealant; and respectively between the edges of the two envelope portions and periphery of the outer surface of the substrate and periphery of the outer surface of the packaging layer are filled by sealant.

In an embodiment, between a lateral side of the substrate and the envelope portion, and/or, between a lateral side of the packaging layer and the envelope portion, which are filled by sealant.

In an embodiment, the combination portion comprises a plurality of subcombination portions and an adherence layer filled between two adjacent layers of subcombination portions, and the two enveloped portions are respectively extending from each one of the subcombination portions.

In an embodiment, the sealant is filled between the substrate and the edge of the packaging layer.

In an embodiment, a desiccating is positioned between the packaging strip and the light-emitting layer.

According to another aspect of the disclosure, the disclosure further provides a packaging method of OLED device. The packaging method of OLED device comprising following steps.

Processing a substrate and a light-emitting layer;

Coating sealant on periphery of an upper surface of the substrate;

Pasting one side of a combination portion of a packaging strip to sealant of the upper surface of the substrate, and coating sealant on another side of the combination portion;

Positioning the packaging layer on sealant of the combination portion;

Bending one envelope portion which above the packaging strip, and pasting to an outer surface of the packaging layer;

Flipping the substrate and the light-emitting layer for upward positioning bottom of the substrate; and Bending another envelope portion which on the packaging strip, and pasting to an outer surface of the substrate.

In an embodiment, in the step of pasting one side of the combination portion of the packaging strip to the sealant of the upper surface of the substrate, further coating sealant on an upper surface of the envelope portion which above the packaging strip.

Enclosing a space for light-emitting layer by substrate, packaging layer, packaging strip according to the packaging strip enveloping periphery of upper and lower surfaces of the substrate and packaging layer in this present invention. Also, positioning sealant between the packaging strip and substrate, and between the packaging strip and packaging layer, it provides better package effectiveness therebetween. Therefore, it is elongating the path which enters from sealant position to inner of OLED device by moisture, oxygen and so on. It enhances the blocking effect of moisture, oxygen in the display device, and ensures the lifetime and reliability.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF THE PREFERRED EMBODIMENTS

Figure 1:
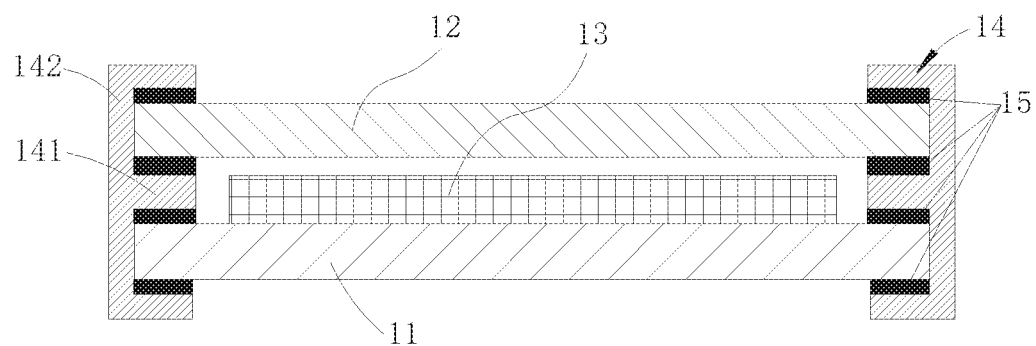
FIG. 1 is a structural schematic view of a first kind of OLED device according to a first embodiment of the disclosure.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure.

Further, some of the terms above may be used in addition to the orientation or positional relationship represent, may also be used to indicate other meanings, such as "on" in some cases the term may also be used to express some dependency or connection relationship. For those of ordinary skill in the art, the meaning of these terms will be understood in the present invention depending on the circumstances.

The specific structural and functional details disclosed herein are only representative and are intended for describing exemplary embodiments of the disclosure. However, the disclosure can be embodied in many forms of substitution, and should not be interpreted as merely limited to the embodiments described herein.

Embodiment 1

Please refer to FIG. 1. The OLED device of this embodiment comprises a substrate 11, a packaging layer 12, a light-emitting layer 13, and a packaging strip 14. The light-emitting layer 13 is positioned between the substrate 11 and the packaging layer 12, and the packaging strip 14 is packaged on an edge of the packaging layer 12 and edge of the substrate 11, the light-emitting layer 13 is enclosed in a space surrounded by the substrate 11, the packaging layer 12 and the packaging strip 14.

The substrate 11 is glass substrate or metal sheet, or made by polymer material of polyimide (PI), polycarbonate (PC), polyethersulfone (PES), polyethylene terephthalate (PET), polyethylene naphthalate) (PEN), polyarylate (PAR) or fiber-reinforced plastic (FRP) which has better flexible and strength. The light-emitting layer 13 includes each layers of thin film transistor TFT, planar layer, pixel defining layer, anode, and cathode and so on, which are necessary structure of the OLED device. The packaging layer 12 major includes a cover for packaging. The packaging strip 14 is made by polymer material of polyimide (PI), polycarbonate (PC), polyethersulfone (PES), polyethylene terephthalate (PET), poly(ethylene naphthalate) (PEN), polyarylate (PAR) or fiber-reinforced plastic (FRP). The packaging strip 14 is made by the same material as the packaging layer 12.

The packaging strip 14 is packaging for end of the OLED device. Two ends of the packaging strip 14 are respectively extending to cover a lateral side of the packaging layer 12, a lateral side of the substrate 11, periphery of the outer surface of the packaging layer 12 and periphery of the outer surface of the substrate 11. Sealant 15 is filled between an inner surface of the packaging strip 14 and the outer surface of the substrate 11, and sealant 15 is filled between an inner surface of the packaging strip 14 and the outer surface of the packaging layer 12.

The packaging strip 14 comprises a combination portion 141 and two envelope portions 142 respectively extended from the combination portion 141. The combination portion 141 is positioned between the substrate 11 and the packaging layer 12. Two envelope portions are respectively enveloping end of the substrate 11 and periphery of the outer surface of the substrate 11, and end of the packaging layer 12 and periphery of the outer surface of the packaging layer 12. And sealant 15 is filled between lower surface of the combination portion 141 and the substrate 11, sealant 15 is filled between upper surface of the combination portion 141 and the packaging layer 12. Sealant 15 are filled between ends of the two envelope portions 142 are respectively with periphery of the outer surface of the substrate 11 and periphery of the outer surface of the packaging layer 12 are filled by sealant 15.

The upper surface and the lower surface of the packaging layer 12 of the OLED device are respectively pasted to the envelope portion 142 and the combination portion 141 of the packaging strip 14 by sealant 15. The upper surface and the lower surface of the substrate 11 are respectively pasted with the combination portion 141 and the envelope portion 142 of the packaging strip 14 by sealant 15, which double the width of the sealant 15. At this time, it also is doubling the path which enters from sealant position to inner of OLED device by moisture, oxygen and so on. It ensures the lifetime and reliability of display device.

Figure 2:
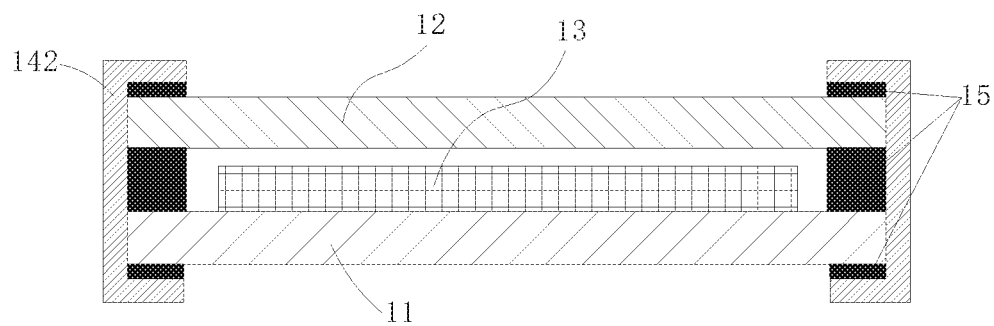
FIG. 2 is a structural schematic view of a second kind of OLED device according to the first embodiment of the disclosure.

Please refer to FIG. 2. FIG. 2 is a structural schematic view of another OLED device according to this embodiment. The packaging strip 14 does not have the combination portion 141, and two of the envelope portions 142 are connected to each other. The ends of two envelope portions 142 are respectively cover the end and edge of the substrate 11 and the end and edge of the packaging layer 12, and sealant 15 is filed between the edge of the substrate 11 and the edge of the packaging layer 12.

Figure 3:
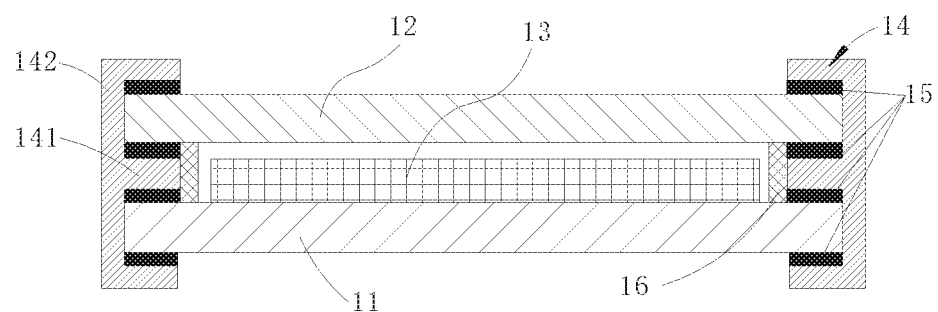
FIG. 3 is a structural schematic view of a third kind of OLED device according to the first embodiment of the disclosure.

Please refer to FIG. 3. FIG. 3 is a structural schematic view of further OLED device according to this embodiment. A desiccating 16 is positioned between the packaging strip 14 and the light-emitting layer 13 for absorption moisture. Specifically, the desiccating 16 is positioned on the surface which is positioned toward to the light-emitting layer 13 of the combination portion 141. The desiccating 16 also be pasted on the end of the sealant 15 which positioned on the upper surface and lower surface of the combination portion 141. The upper end and the lower end of the desiccation 16 are respectively contacted against to the surface of the substrate 11 and the surface of the packaging layer 12, which formed a confined space with the substrate 11 and the packaging layer 12. Therefore, it could prevent moisture enters the device and effect the light-emitting layer 13.

Figure 4A:
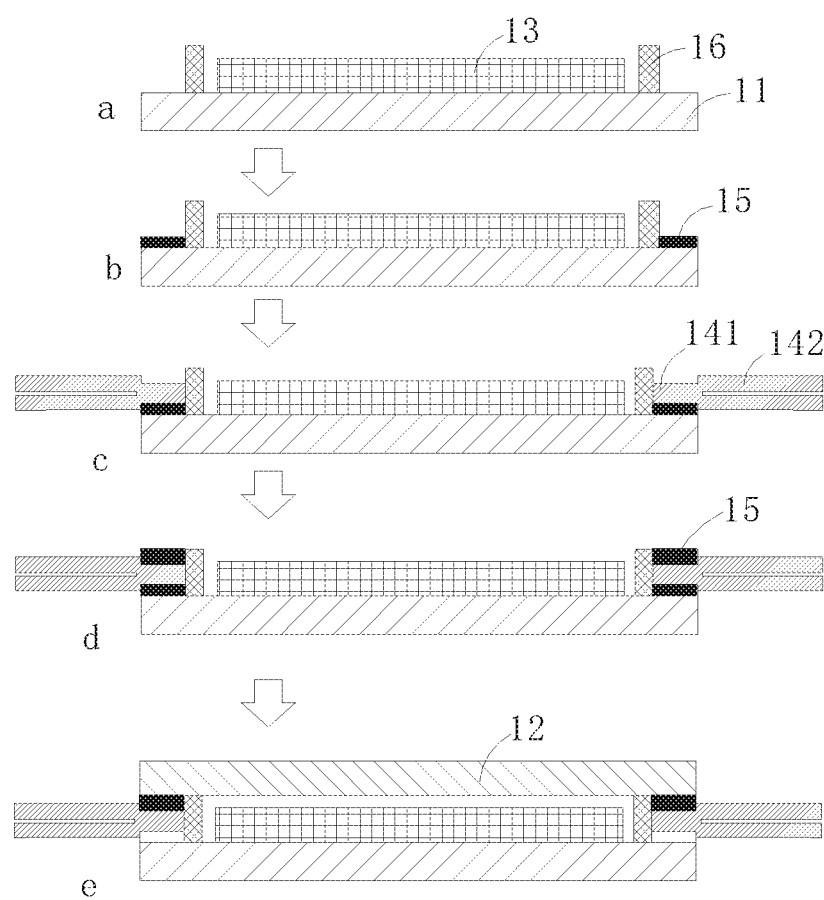
FIG. 4*a*-4*b* is a schematic view of manufacture process the OLED device shown in FIG. 3 of the disclosure.
Figure 4B:
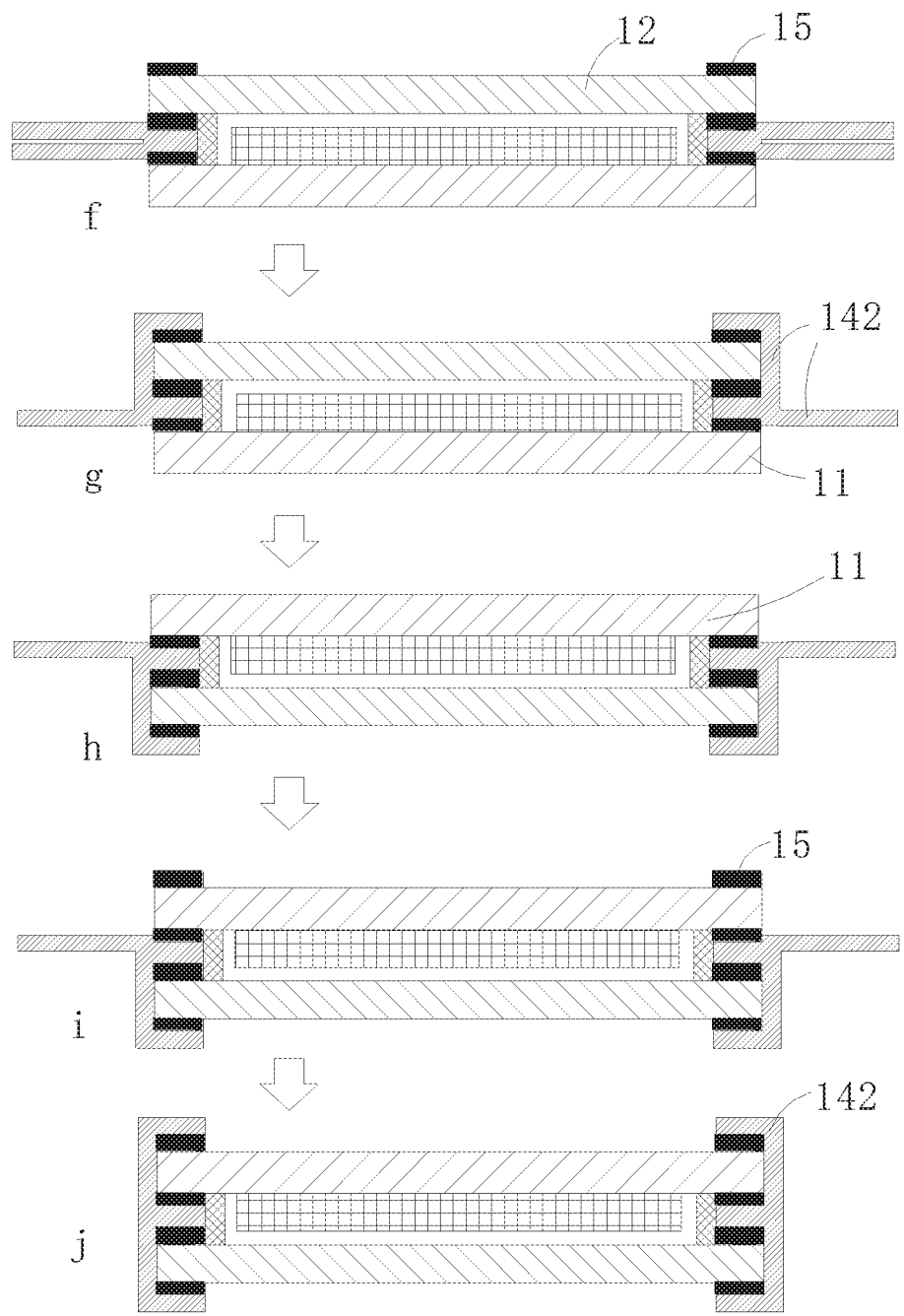
Figure 5:
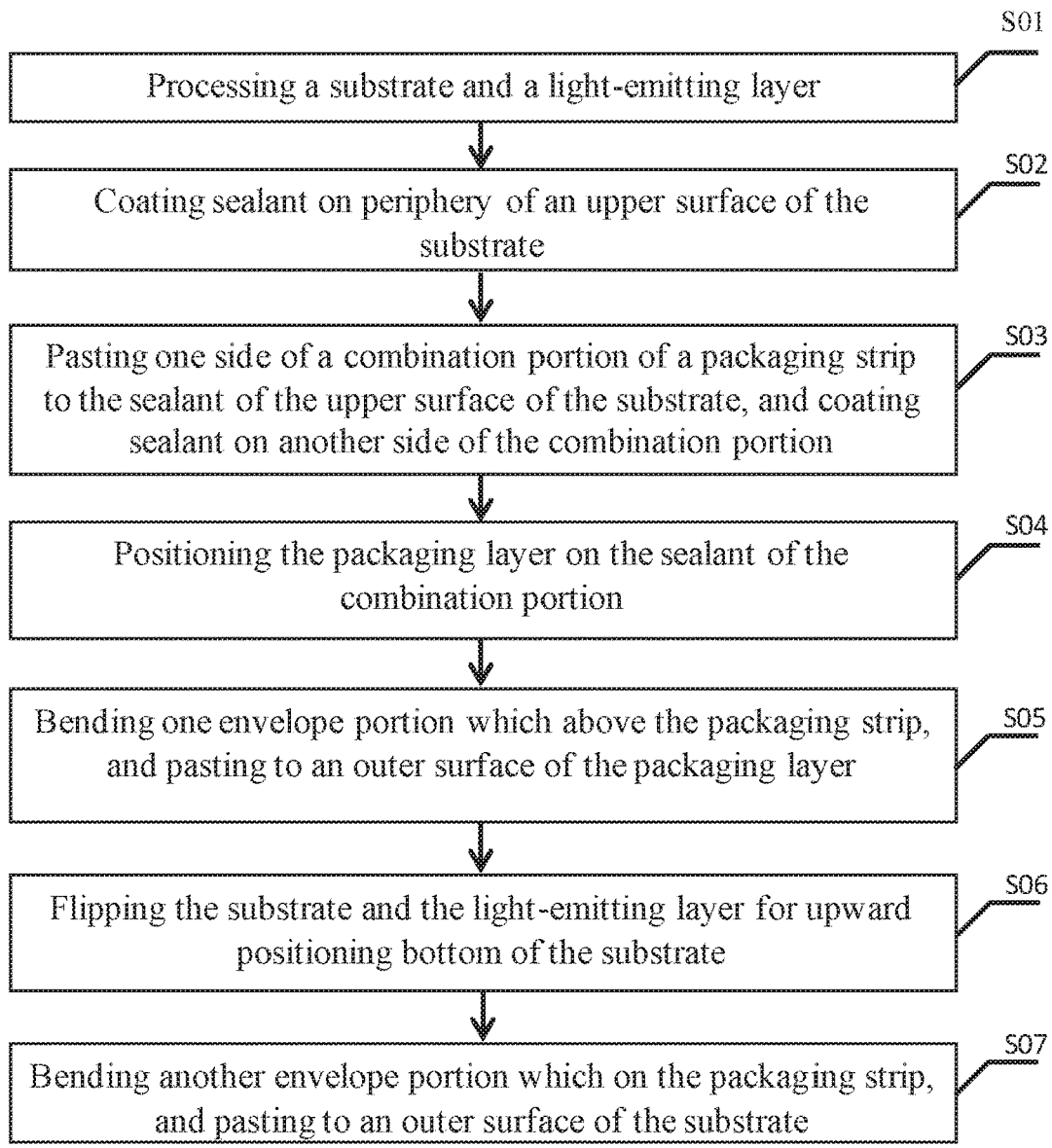
FIG. 5 is a manufacture method flow chart of the OLED device shown in FIG. 3 of the disclosure.

Please refer FIG. 4a, 4b and FIG. 5. The packaging method of the OLED device in this embodiment comprising following steps.

S01, processing the substrate 11 and the light-emitting layer 13, and surrounding and positioning a desiccating 16 on the surface which positioned the light-emitting layer 13 of the substrate 11, and surround the light-emitting layer 13 inside the desiccating 16. (The step a shown as FIG. 4a)

S02, coating sealant 15 on periphery of upper surface of the substrate 11. (The step b shown as FIG. 4a) The sealant 15 is coated on periphery of the desiccating 16 and is adjacent to the desiccating 16.

S03, pasting one side of the combination portion 141 of a packaging strip 14 on the sealant 15 of the upper surface of the substrate 11, and coating sealant 15 on another side of the combination portion 141. (The steps c, d shown as FIG. 4a)

S04, positioning the packaging layer 12 on the sealant 15 of the combination portion 141. (The step e shown as FIG. 4a) The lower surface of the packaging layer 12 is simultaneously contacted to top of the desiccating 16.

S05, bending one envelope portion 142 which above the packaging strip 14 and pasting the envelope portion 142 to outer surface of the packaging layer 12. As shown in FIG. 4b, the steps f, g. Firstly, coating a surrounding sealant 15 on periphery of the upper surface of packaging layer 12, and then bending the envelope portion 142 above the packaging strip 14 for pasting end of the envelope portion 142 to the sealant 15 which on the periphery of the upper surface of the packaging layer 12.

S06, flipping the substrate 11 and the light-emitting layer 13 for upward positioning bottom of the substrate 11. (The step h shown as FIG. 4b)

S07, bending another envelope portion 142 which above the packaging strip 14 and pasting the envelope portion 142 on outer surface of the substrate 11. (The steps i, j shown as FIG. 4a) Pasting process of the envelope portion 142 basically as same as the pasting process of the envelope portion 142 in step S05.

In the packaging process could further includes at least one or several steps of high temperature treatment or UV treatment for sealant 15, it provides better package performance and adherence for sealant 15 pasting to the substrate 11, the packaging layer 12 and the packaging strip 14.

Embodiment 2

Figure 6:
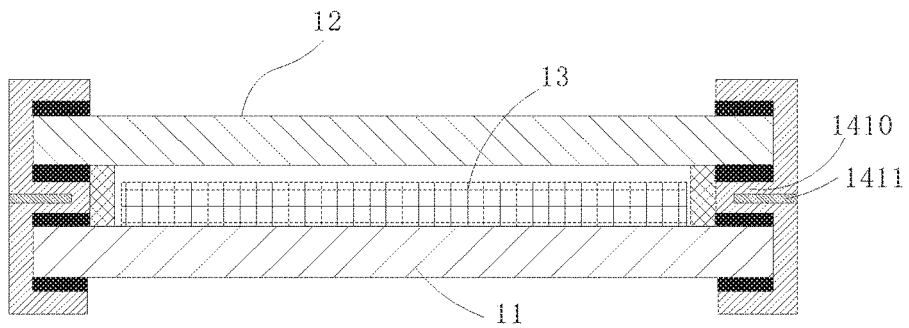
FIG. 6 is a structural schematic view of one kind of OLED device according to a second embodiment of the disclosure.

Please refer to FIG. 6, the difference between the embodiment 1 which is structure of the packaging strip 14. Please also refer to FIG. 7a, in this embodiment, the combination portion 14 of the packaging strip 14 comprises two layers of subcombination portions 1410 and an adherence layer 1411 filled between two adjacent layers of subcombination portions 1410. The two enveloped portions 142 are respectively extending from the subcombination portions 1410. The layer number of subcombination portions 1410 is not limited here, it could be adjusted accordingly.

The packaging strip 14 is a long-strip shaped in unfolded state. In the manufacture process, coating the adherence layer 1411 on a side which nearby the middle part of the long-strip shaped material, for example optical adhesive or other adhesive. And then, folding the adherence layer 1411 which nearby boundary of middle part and the adherence layer 1411 is combined between the two lateral parts (left part, right part) of the packaging strip material.

Figure 7A:
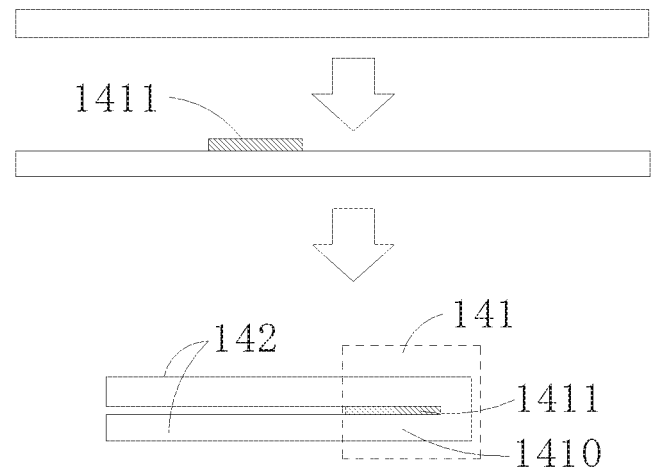
FIG. 7*a* is a schematic view of manufacture process of one kind of the packaging strip according to the second embodiment of the disclosure.
Figure 7B:
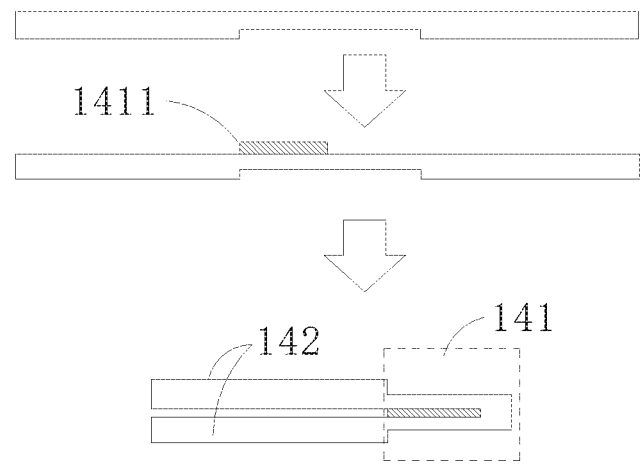
FIG. 7*b* is a schematic view of manufacture process of another kind of the packaging strip according to the second embodiment of the disclosure.
Figure 7C:
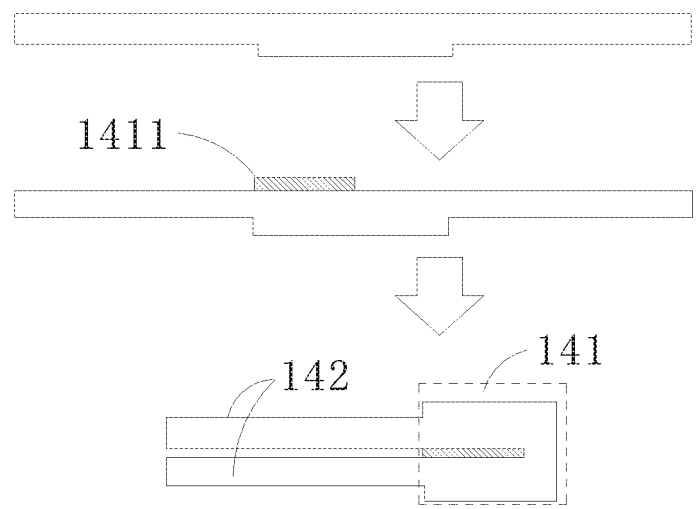
FIG. 7*c* is a schematic view of manufacture process of further kind of the packaging strip according to the second embodiment of the disclosure.

FIGS. 7a, 7b and 7c are respectively showing situations of thickness of the combination portion 141 is equal to, less than and greater than the thickness of each subcombination portions 1410. The structure and manufacture method of these three types of packaging strips 14 could be selective by thickness of the light-emitting layer 13, for example, it could using greater thickness of the combination portion 141 of packaging strip 14 for packaging process when the light-emitting layer 13 is more thicker.

Embodiment 3

Figure 8:
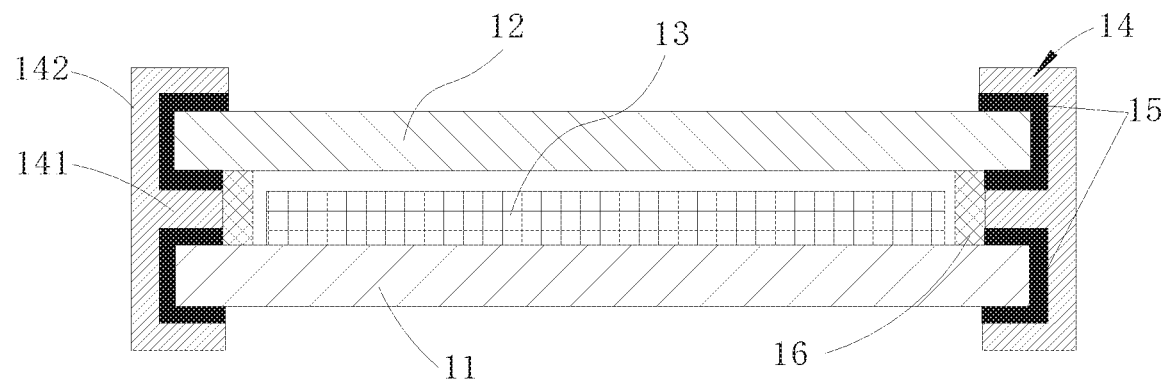
FIG. 8 is a structural schematic view of a first kind of OLED device according to a third embodiment of the disclosure.

Please refer to FIG. 8, the difference between the embodiment 1 will be described below. In this embodiment, sealant 15 is filled between the envelope portion 142 of the combination portion 141 and end of the substrate 11; sealant 15 is filled between the envelope portion 142 of the combination portion 141 and end of the packaging layer 12; sealant 15 is filled between the desiccating 16 and the combination portion 141, which means the sealant 15 is coating on all inner surface of the packaging strip 14. Therefore, one layer of packaging material is positioned between the desiccating 16 and the combination portion 141, and enhancing packaged effect.

Figure 9A:
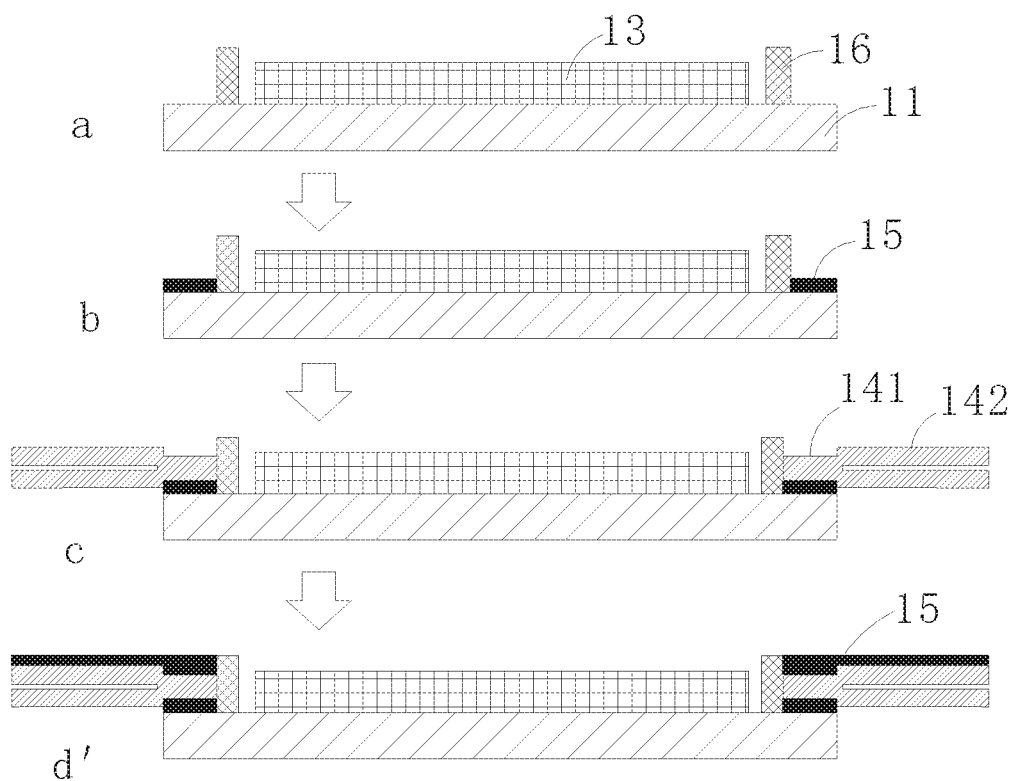
FIG. 9*a*-9*b* is a schematic view of manufacture process of the OLED device shown in FIG. 8 of the disclosure.
Figure 9B:
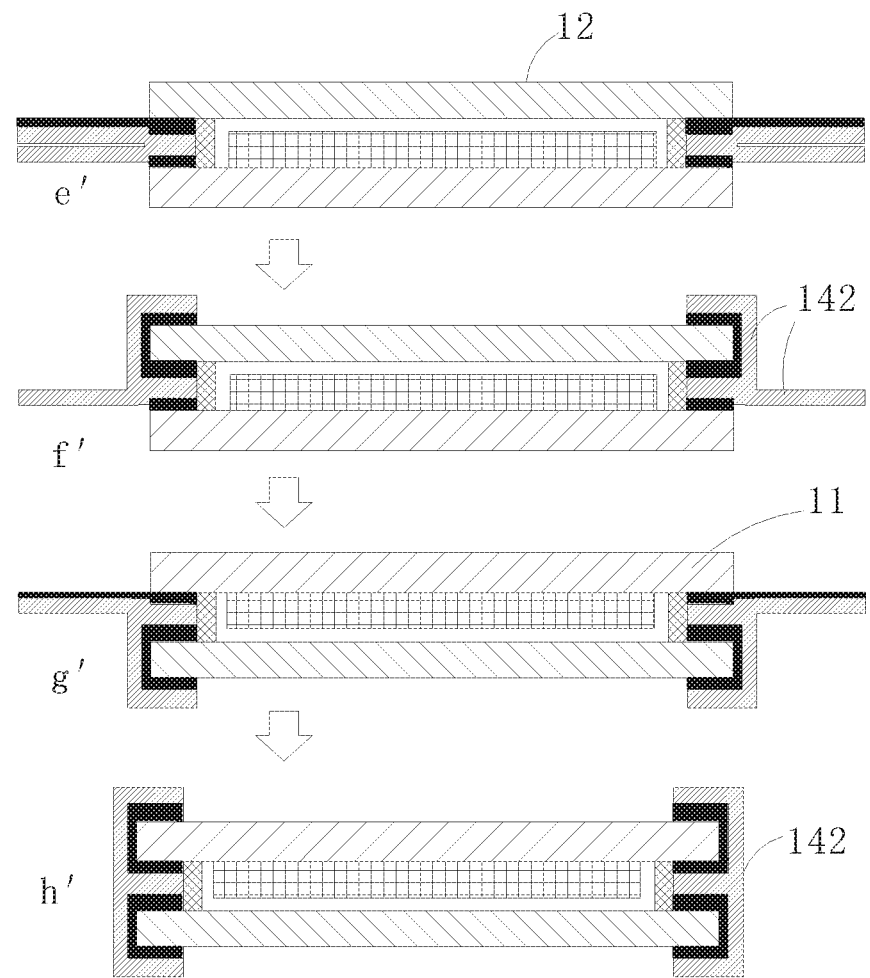

Please refer to 9a, 9b, the difference manufacture method of OLED between the above embodiment will be described below. In steps S01 and S02 of this embodiment as same as the embodiment 1. Specifically, in the step S03, the pasting one side of a combination portion 141 of a packaging strip 14 to the sealant 15 of the upper surface of the substrate 11, further coating sealant 15 on the upper surface of the above envelope portion 142. (The step d' shown as FIG. 9a) Then in step S04, positioning the packaging layer 12 on the sealant 15 of the combination portion 141. (The step e' shown as FIG. 9a) In the step S03, because there is also coating sealant 15 on upper surface of the above envelope portion 142 so that it only needs to bend and press the above envelope portion 142 of the packaging strip 14 to upper surface of the packaging layer 12 for adherence and package in step S05. (The step f' shown as FIG. 9b) Base on the same principle, in the step S07 bending and pasting another envelope portion 142 to outer surface of substrate 11, it only needs to bend and press another envelope portion 142 of the packaging strip 14 to outer surface of the substrate 11 for adherence and package together. (The step h' shown as FIG. 9b)

Same, in the packaging process could further includes at least one or several steps of high temperature treatment or UV treatment for sealant 15, it provides better package performance and adherence for sealant 15 pasting to the substrate 11, the packaging layer 12 and the packaging strip 14.

Figure 10:
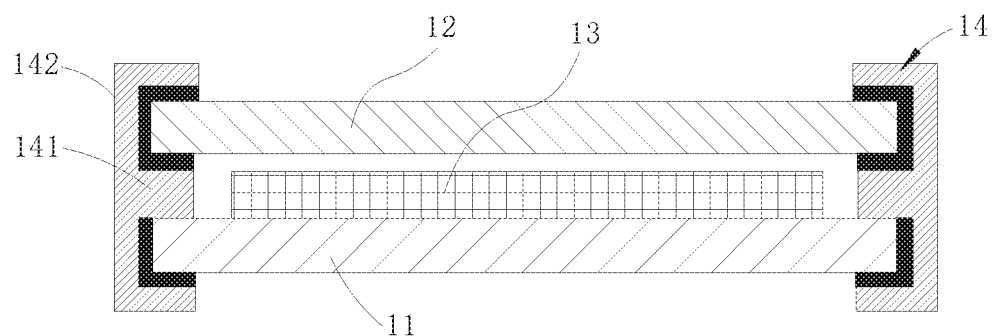
FIG. 10 is a structural schematic view of a second kind of OLED device according to the third embodiment of the disclosure.

In addition, please refer to FIG. 10. Only one of the upper surface and lower surface of the middle of combination portion 141 is filled by sealant 15, and pasting the substrate 11 or packaging layer 12.

Figure 11:
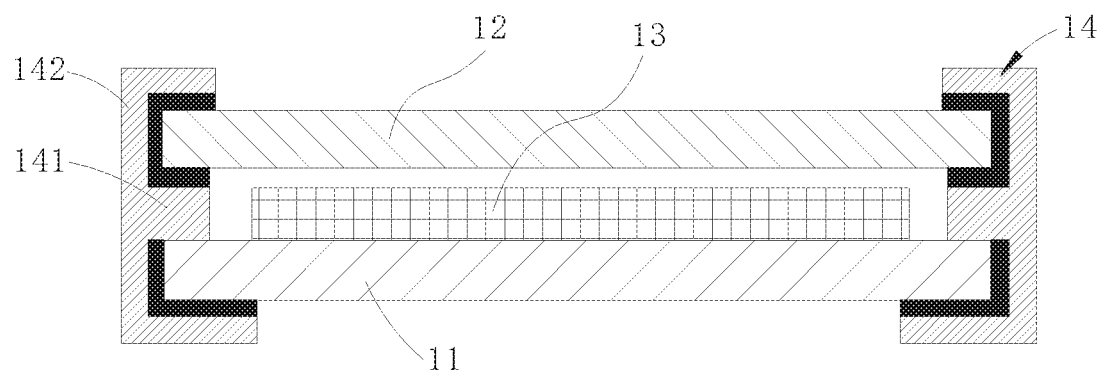
FIG. 11 is a structural schematic view of a third kind of OLED device according to the third embodiment of the disclosure.

Please refer to FIG. 11. Length of the two envelope portions 142 are difference. When length of the envelope portion 142 which enveloping substrate 11 is greater the length of the envelope portion 142 which enveloping packaging layer 12. Light emitted from the packaging layer 12 by the light-emitting layer 13 will not be shielded by envelope portion 142. So that, this design is suitable for top-emitting OLED device. When length of the envelope portion 142 which enveloping packaging layer 12 is greater the length of the envelope portion 142 which enveloping substrate 11, light emitted from the substrate 11 by the light-emitting layer 13 will not be shielded by envelope portion 142. So that, this design is suitable for bottom-emitting OLED device.

In sum, enclosing a space for light-emitting layer by substrate, packaging layer, packaging strip according packaging strip enveloping periphery of upper and lower surface of the substrate and packaging layer in this present invention. Also, positioning sealant between the packaging strip and substrate, and between the packaging strip and packaging layer, it provides better package effectiveness thereof. Therefore, elongating path which enter from sealant position to inner of OLED device for moisture, oxygen and so on. It enhances the blocking effect of moisture, oxygen in the display device, and ensures the lifetime and reliability.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An OLED device, comprising
   a substrate,
   a packaging layer,
   a light-emitting layer, and
   a packaging strip,
   wherein the light-emitting layer is positioned between the substrate and the packaging layer, and the packaging strip is packaged on an edge of the packaging layer and an edge of the substrate, the light-emitting layer is enclosed in a space surrounded by the substrate, the packaging layer and the packaging strip,
   wherein the packaging strip comprises a combination portion, the combination portion is positioned between the substrate and the packaging layer, and overlapped with the substrate and the packaging layer in a normal direction of the substrate.

2. The OLED device according to claim 1, wherein a desiccating is positioned between the packaging strip and the light-emitting layer.

3. The OLED device according to claim 1, wherein two ends of the packaging strip are respectively extending to cover an outer surface of the substrate and an outer surface of the packaging layer.

4. The OLED device according to claim 3, wherein a desiccating is positioned between the packaging strip and the light-emitting layer.

5. The OLED device according to claim 3, wherein between an inner surface of the packaging strip and the outer surface of the substrate, and between an inner surface of the packaging strip and the outer surface of the packaging layer, which are filled by sealant.

6. The OLED device according to claim 5, wherein a desiccating is positioned between the packaging strip and the light-emitting layer.

7. The OLED device according to claim 5, wherein the packaging strip comprises two envelope portions respectively extended from the combination portion, the envelope portions are respectively enveloping an end of and an edge of the outer surface of the substrate and an end of and an edge of the outer surface of the packaging layer; between the combination portion and the substrate, and/or, between the combination portion and the packaging layer are filled by sealant; and respectively between the edges of the two envelope portions and periphery of the outer surface of the substrate and periphery of the outer surface of the packaging layer are filled by sealant.

8. The OLED device according to claim 7, wherein a desiccating is positioned between the packaging strip and the light-emitting layer.

9. The OLED device according to claim 7, wherein between a lateral side of the substrate and the envelope portion, and/or, between a lateral side of the packaging layer and the envelope portion, which are filled by sealant.

10. The OLED device according to claim 9, wherein a desiccating is positioned between the packaging strip and the light-emitting layer.

11. The OLED device according to claim 7, wherein the combination portion comprises a plurality of subcombination portions and an adherence layer filled between two adjacent layers of subcombination portions, and the two enveloped portions are respectively extending from each one of the subcombination portions.

12. The OLED device according to claim 11, wherein a desiccating is positioned between the packaging strip and the light-emitting layer.

13. The OLED device according to claim 5, wherein the sealant is filled between the substrate and the edge of the packaging layer.

14. The OLED device according to claim 13, wherein a desiccating is positioned between the packaging strip and the light-emitting layer.

15. A packaging method of OLED device, comprising steps:
    processing a substrate and a light-emitting layer;
    coating sealant on periphery of an upper surface of the substrate;
    pasting one side of a combination portion of a packaging strip to sealant of the upper surface of the substrate, and coating sealant on another side of the combination portion;
    positioning a packaging layer on sealant of the combination portion;
    bending one envelope portion which above the packaging strip, and pasting to an outer surface of the packaging layer;

flipping the substrate and the light-emitting layer for upward positioning bottom of the substrate; and bending another envelope portion which on the packaging strip, and pasting to an outer surface of the substrate.

16. The packaging method of OLED device according to claim 15, wherein in the step of pasting one side of the combination portion of the packaging strip to the sealant of the upper surface of the substrate, further coating sealant on an upper surface of the envelope portion which above the packaging strip.

17. The packaging method of OLED device according to claim 15, wherein in the step of processing the substrate and the light-emitting layer, further surrounding and positioning a desiccating on edge of surface which positioned the light-emitting layer of the substrate, and surround the light-emitting layer inside.

18. The packaging method of OLED device according to claim 17, wherein in the step of coating sealant on periphery of an upper surface of the substrate, the sealant is coated on periphery of the desiccating and adjacent to the desiccating.

19. The packaging method of OLED device according to claim 18, wherein in the step of positioning the packaging layer on sealant of the combination portion, a lower surface of the packaging layer is simultaneously contacted to top of the desiccating.

20. The packaging method of OLED device according to claim 17, wherein between the desiccating and the combination portion is filled by sealant.

* * * * *